United States Patent [19]
Healey, III et al.

[11] 3,836,873

[45] Sept. 17, 1974

[54] LOW NOISE VHF CRYSTAL HARMONIC OSCILLATOR

[75] Inventors: Daniel J. Healey, III; Michael M. Driscoll, both of Baltimore, Md.

[73] Assignee: Westinghouse Electric Corporation, Pittsburgh, Pa.

[22] Filed: July 2, 1973

[21] Appl. No.: 375,524

[52] U.S. Cl. ............... 331/116 R, 331/109, 331/159
[51] Int. Cl. ............................................ H03b 5/36
[58] Field of Search ................. 331/109, 116 R, 159

[56] References Cited

UNITED STATES PATENTS

| | | | |
|---|---|---|---|
| 2,757,288 | 7/1956 | Jacobsen | 331/159 |
| 3,254,314 | 5/1966 | Healey | 331/159 |
| 3,427,568 | 2/1969 | Bath | 331/159 |
| 3,736,523 | 5/1973 | Puskas | 331/116 R |

*Primary Examiner*—John Kominski
*Attorney, Agent, or Firm*—D. Schron

[57] ABSTRACT

A two transistor VHF crystal controlled harmonic oscillator provides a large ratio of output power to crystal unit power dissipation without significant degradation of oscillating resonator Q from the crystal unit Q defined herein as $Q_x$. A cascode amplifier configuration comprising first and second transistors in combination with inductance and capacitance elements provides an oscillator configuration with phase shift in the vicinity of the oscillator frequency dominantly controlled by the quartz crystal unit motional impedance parameters. The first and second transistors are operated under linear conditions during the complete cycle of oscillation current, and two hot carrier diodes operated with appropriate biasing voltages provides the limiting characteristic required in harmonic oscillators. Circuit applications may use one or two VHF crystal units with appropriate antiresonating of circuit capacitance to achieve a desired minimum of phase noise power spectral density in the oscillator circuit.

10 Claims, 14 Drawing Figures

(MODIFIED PIERCE)

(MODIFIED PIERCE)

(MODIFIED PIERCE)

(MODIFIED BUTLER-
BRIDGED TEE)

$$Z = -gmX_1X_2 + j(X_1 + X_2)$$

$$X_1 = \frac{1}{\frac{1}{2\pi f_0} - 2\pi f_0 C_{10}}$$

$$X_2 = \frac{1}{2\pi f_0 C_{11}}$$

LOW NOISE VHF CRYSTAL HARMONIC OSCILLATOR

CROSS REFERENCE TO RELATED APPLICATION

Reference is made to commonly assigned co-pending U.S. Pat. application Ser. No. 383,627 filed July 30, 1973, entitled "Improved Microwave Signal Source and Method" of Daniel J. Healey, III.

BACKGROUND OF THE INVENTION

1. Field of the Invention

This invention relates to oscillator control circuits and, more particularly, to such an oscillator control circuit having very low noise properties.

2. State of the Prior Art

The achievement of high performance from a coherent pulse Doppler radar set (coherent MTI) is dependent on the radar sensitivity in practice being limited by receiver noise that exists in the absence of any received signals. Such systems are essentially single sideband transmitting and receiving apparatus, and separation of received signals occurring simultaneously in time is achieved by separation of the frequency of the signals. The ability to separate a small signal from a large signal by such means is dependent on the FM and PM noise (short-term frequency stability) exhibited by the radar transmitter and the beating signal generators employed to down-convert the received signals to frequencies at which the requisite frequency selective filtering becomes practical.

An important component of such radar sets is the carrier frequency generator employed for the transmitter exciter and the beating signal generator for providing the first frequency changing operation in the receiver. In systems having well designed amplifiers and auxiliary circuits for the transmitter, and a well designed receiver that exhibits adequate cross-modulation and intermodulation characteristics, the performance characteristics of these frequency generators will determine the radar detection performance in the presence of large natural signal interference resulting from ground, sea and cloud echoes.

In such radar systems as well as other communication systems, it is extremely desirable to provide a source of extremely low noise microwave frequency signal. A significant measure of the noise content of a microwave signal is the indication of the power spectrum as provided by the parameter $L(f)$, defined as the ratio of the power in one phase noise sideband referred to the input carrier frequency, on a per Hertz of bandwidth spectral density basis, to the total signal power at an offset Fourier frequency f from the signals average or nominal frequency $f_0$. The parameter $L(f)$ typically is expressed in units of dB/Hz. Such a signal may be referred to as having low noise power levels at Fourier frequencies at some minimal Fourier frequency, where Fourier frequency is defined as the frequency offset from the nominal or average frequency $f_o$ of the signal.

Available microwave signal sources such as crystal controlled oscillators may provide an output signal which has a sufficiently narrow power spectral density in that the signal power level is minimal at low Fourier frequencies about the desired nominal or center frequency $f_o$ of the crystal controlled oscillator. However at high Fourier frequencies about the center frequency $f_o$ of the crystal controlled oscillator. However at high Fourier frequencies about the center frequency $f_o$ of the crystal controlled oscillator, the noise power level may be unacceptable.

On the other hand, a cavity resonator microwave transistor oscillator may provide a microwave signal having acceptable noise characteristics at the higher Fourier frequencies about the center frequency of the oscillator but may be unacceptable at the lower Fourier frequencies.

With either of the above types of microwave frequency signal sources, the output signal power density at frequencies other than in a narrow band about the oscillator center frequency $f_o$ may be sufficiently high that maximum system performance is not attainable, particularly in PAM Doppler radar systems, i.e., pulse Doppler radar systems that employ rectangle pulse amplitude modulation of a low noise carrier frequency. Such limitation of performance is most serious in low duty factor pulse Doppler radar systems that employ either of the two previously described types of microwave signal sources for carrier frequency generation. The limitation is particularly serious at Fourier frequencies in the range of 500 Hz to 50,000 Hz as a result of the effective folding of noize at high Fourier frequencies into the range of 500 Hz to 50,000 Hz as a result of the PAM.

Circuits usually employed for VHF overtone mode crystal controlled oscillators have typically been based on the modified Pierce or the modified Butler (bridged tee circuit) as shown in FIG. 1. The crystal unit desirable in the design of a low noise VHF oscillator may be a fifth overtone AT cut crystal unit oscillating between 80 MHz to 100 MHz. The crystal unit electrostatic capacitance $C_o$ is formed by the two electrodes of the quartz crystal unit with quartz as the dielectric. A problem arises in the design of crystal units related to the untrapping of unwanted inharmonic modes of vibration. Typically, a high Q fifth overtone unit at 80 MHz will have an electrostatic capacitance in the order of 3.0 pF so that the dynamic or motional capacitance, which is the equivalent electrical capacitance of the mechanical resonator, will approximate 0.0005 pF. The crystal holder also introduces 0.2 to 0.5 pF in parallel with the dynamic capacitance. The intrinsic Q of quartz is $2.8 \times 10^6$ at 5.0 MHz. The parameter $Qf_o$ of $1.3 \times 10^{13}$ is essentially constant with frequency up to 100 MHz. Owing to the higher impedance of overtone modes, the crystal unit Q herein defined as $Q_x$ is higher for overtone modes, since the losses associated with the mounting leads and stray capacitance of the crystal holder are fixed and therefore a relatively smaller resistance to the electrically equivalent resonant resistance of the quartz crystal.

At 80 MHz, the crystal unit $Q_x$ approaches 70 percent of the intrinsic Q assuming a well designed crystal unit. Practical crystal units are found to exhibit a $Q_x$ of 90,000 to 130,000 at this frequency. Assuming a $Q_x$ of say 100,000, consider what is required to form an oscillator using the Pierce circuit. The impedance Z of the motional branch of the crystal unit electrical equivalent circuit as shown in FIG. 2 will exhibit an impedance, expressed by the following equation:

$$Z_1 = R_1 = j[(f - f_s)/\pi f_s^2 C_1] \quad (1)$$

where $f_s$ is the resonant frequency, $f$ is the frequency for which $Z_1$ is defined, $C_1$ is the motional capacitance and $R_1$ is the resistance of the motional branch. Since the circuit portion of FIG. 1a connected in parallel with the crystal unit will appear as an impedance $-R - j(X_1 + X_2)$ derived as shown in FIG. If shunted by the collector-to-base capacitance plus stray capacitance of the circuit, it is necessary that oscillation, if it could occur, be at a frequency $f$ such that the crystal unit is inductive in accordance with the above equation, and of value that resonates the capacitance of the oscillator circuit. The problem is that because of the large value of $C_o/C_1$, the equivalent positive resistance exhibited by the crystal unit at its terminals rapidly increases as the frequency departs from the resonant frequency. Consider the following values:

$f_s$ = 80 MHz, fifth overtone crystal unit

| Frequency ($f_o$) | Motional Z (ohms) | Crystal unit $Z_x$ (ohms) | Total (ohms) |
|---|---|---|---|
| $f_s$ + 1500 Hz | 39 + $j$ 149.20 | 66.9 + $j$ 190 | 143 + $j$ 258 |

Note:

$R_1 = 1/2\pi f_s C_1 Q_x$

The crystal unit $Z_x$ is the impedance at the crystal unit terminals, and the total is the impedance when the collector-to-base capacitance is absorbed as part of the crystal unit. Now the effective transconductance that is attainable at VHF from the oscillator circuit is in the order of (0.2) × (Ie/26), where Ie is the dc current of the transistor element in the Pierce circuit in $m$A. There is a positive part of input resistance associated with the effects of base spreading resistance and transit time that can be viewed simply as further reduction in effective transconductance as well as a degrading factor of oscillating resonator $Q_l$. For the VHF oscillator the effective gm can then be considered to be about 0.1 Ie/26 or for low noise oscillators about 19,000 micromhos. The impedance of $X_1$ and $X_2$ that are required for −143 ohms input resistance is then $-j$ 86.7 ohms. This is a capacitance of 22.9 pF at 80 MHz. The typical transistor such as 2N2857 has ft approximately 1,000 MHz and $h_{FE}$ approximately 50. The base-to-emitter capacitance at Ie of 5$m$A is then about 30.6 pF so it is seen that an oscillator cannot be realized readily. If one permits the transistor capacitance $C_{be}'$ to establish $X_2$, then for −143 ohms, $X_1$ must be 114 ohms. Under such conditions of operation, however, $r_{bb}'$ the base spreading resistance needs to be included as part of the resonator impedance which leads to 220 ohms instead of 143 ohms assuming $r_{bb}' = 50$ ohms, $C_{cb}' = 2.0$ pF, strays 1.0 pF. The oscillating resonator $Q_l$ is then about $(80/50 + 81)Q_x = 0.618\ Q_x$ due only to base spreading resistance. This can be improved by lower $r_{bb}'$, but then transit time problems or excessive $C_{be}'$ are encountered. The value of $X_1$ must be 175 ohms. $X_1 + X_2$ is then 240 ohms. Oscillation then is possible at approximately 1,500 Hz above the crystal unit resonant frequency.

There are several characteristics of the modified Pierce circuit that make it unsatisfactory for low FM noise at VHF.

1. the source impedance is relatively large since the circuit between base and emitter and base-collector is an antiresonant circuit. The antiresonant resistance is approximately $$143\ [1 + [(258/143)]^2] = 608 \text{ ohms.}$$

This is a source of thermal noise and further causes the current noise of the transistor to be more effective in perturbing signal current phase and hence reducing the short term frequency stability. As a result, the ultimate vaule for $S_{\delta\phi}(f)$ the spectral density of the oscillator phase is much higher than that of a bridged tee circuit.

2. the oscillating resonator $Q_l$ is degraded by 30 to 40 percent from the crystal unit $Q_x$.
3. the most serious factor, however, is that in a well designed oscillator, the amplitude modulation of the signal current by low frequency noise results from the non-linear operation that is essential as the resulting phase fluctuation caused by the conversion of AM to PM in the transistor, but in this case of VHF Pierce oscillators, direct fluctuation of transistor reactance occurring from the amplitude fluctuation occurs, and since the transistor provides all of $X_2$ in the example noted, direct noise frequency modulation of the oscillating resonator occurs, and the result is that the FM noise is typically as much as 20 dB higher than exists in a well designed oscillator, as described in an article by the inventor of this invention, entitled "Flicker of Frequency and Phase and White Frequency and Phase Fluctuation in Frequency Sources," Twenty-Sixth Annual Frequency Control Symposium, June 1972.

At HF, the two tandem connected transistors as described in the above-noted article, reduce the direct FM as well as loading of the oscillating resonator. At VHF, however, this circuit does not yield the same improvement, and the FM noise of the Pierce circuit is higher than with the bridged tee, although the oscillating resonator $Q_l$ can be made about two or three times larger than the bridged tee which makes the frequency noise cut-off $f_c = f_o/2Q$, one-half that attained in the simple bridged tee circuit.

As indicated above, one indication of the noise content of a microwave signal is the power spectral density $L(f)$ of that signal. Assuming that harmonic currents can be neglected and that amplitude power spectral density is much smaller than the power spectral density due to phase fluctuations, the power spectral density of an oscillator circuit, for example that described in the above-noted article, may be expressed in terms of its phase noise power spectral density $L_G(f)$ as $$L_G(f) = (1/2)S_{a\delta\phi}(f)\ [1 + [(f_o/2Qf)]^2]\ H(f) \quad (2)$$

The subscript G designates that $L(f)$ is the defined parameter for frequency generators and/or oscillators. The single-sided power spectral density $S_{\delta G}(f)$ is related to $L_G(f)$ by the following relationship:

$$L_G(f) = [(1/2 \text{ rad}^2)]\ S_{\delta G}(f) \quad (3)$$

when phase fluctuations occurring at rates $f$ and faster are small compared to one radian. Note that the designation $L_A(f)$ is used for the amplifier limiter of an oscillator whereas $L_G(f)$ is used for the entire oscillator. The above equations (2) and (3) are fundamental equations describing the short-term frequency stability of a harmonic oscillator. The first term of equation (2) is the frequency noise of the oscillator and the second term is the additive phase noise. It can be seen that for a Fourier freqeuncy $f$ less than the quantity $f_o/2Q$, the oscillator output signal noise power spectrum as indicated by the term $L_G(f)$ is dominated by the frequency noise term. For Fourier frequencies $f$ greater than the quantity $f_o/2Q$, the additive phse noise term dominates the oscillator output signal noise power spectrum. $H(f)$ depends on the circuit configuration and in some circuit its filtering of $L(f)$ due to additive phase prevents observation of transition from frequency noise to additive phase noise.

The bridged tee circuit has the advantage that at high Fourier frequencies the ultimate $S_{A\delta o}(f)$ can be made very low, typically 10 to 20 dB lower than attainable with the Pierce circuit. The disadvantage of such a circuit is that in order to benefit from such low noise, the oscillating resonator $Q_l$ can only be made 10 to 20 percent of crystal unit $Q_x$.

To achieve the conditions for lowest $L_G(f)$, the bridged tee circuit appeared the best choice for an oscillator circuit. However, it is needed to devise a circuit of such form in which the ratio of output power to crystal unit dissipation can be increased, and in which the oscillating resonator $Q_l$ can be increased. A cascode amplifier in which the common base stage provides the limiting function was the first attempt at such improvement to the bridged tee. The design and performance of a 5 MHz oscillator using such a circuit as shown in FIG. 4, is reported in a paper, "Two-Stage Self-Limiting Series Mode Type Quartz Crystal Oscillator Exhibiting Improved Short-Term Frequency Stability," by M. M. Driscoll, twenty-sixth Annual Frequency Control Symposium, bearing the date of June 1972, but distributed August 1972.

The problem with the circuit of FIG. 4 is that although the flicker of phase in $Q_1$ can be suppressed by 20 to 30 dB, the flicker of phase introduced by $Q_2$ can be reduced only about 10 dB as a result of the fact that although the circuit appears to hvae the requisite negative feedback, it must provide the self-limiting function. In addition, when operation at VHF is attempted with the circuit of FIG. 4, the phase shift resulting from parasitic reactances in combination with the limiting function, and the significant reactance shunting the crystal unit at high Fourier frequencies tends to make the circuit unsuitable as a low-noise VHF crystal controlled oscillator.

SUMMARY OF THE INVENTION

It is therefore an object of this invention to provide a VHF oscillator circuit having exceptionally low phase noise sidebands surrounding the nominal frequency of oscillation of the signal obtained from the oscillator; such low noise is characterized by a small value of $L(f)$.

It is a more particular object of this invention to provide an improved circuit permitting the features of a bridged tee circuit to be realized in reducing the additive phase noise at large offset frequencies (Fourier frequency) from the nominal oscillator frequency and further, simultaneously permitting the frequency noise cutoff to bu substantially reduced.

It is a still further object of this invention to reduce the $1/f$ power spectral density that dominates $L_G(f)$ at low Fourier frequencies.

It is a still further object of this invention to employ negative feedback in the amplifier circuit during the entire cycle of the oscillation current.

In accordance with these and other objects of the invention, there is provided a low noise, high-frequency oscillating circuit comprising first and second amplifiers, each having first and third terminals for receiving an input whereby an output derived from its second terminal is determined. In one illustrative embodiment of this invention, the amplifiers comrise first and second transistors wherein the emitter of the second transistor is connected to the collector of the first transistor. Further, there is included a first resonating circuit coupled to said second terminal of said second amplifier means and to said first terminal of said first amplifier means for establishing a resonating signal between the first resonating circuit and the first and second amplifiers. A second resonating circuit comprising an element for providing a reference frequency signal is coupled to the third terminal of the first amplifier.

In one particular embodiment, a second resonating circuit comprising a capacitive element and an inductive element, is connected in parallel with the reference frequency element for antiresonating the electrostatic capacitive of such reference element. In an illustrative embodiment of this invention, the reference frequency element may take the form of a quartz crystal unit.

In a further aspect of this invention, the voltage appearing at the collector of the second transistor is limited within a defined range to minimize non-linear signal limitation in the first and second transistors. In one illustrative embodiment first and second diodes are coupled in parallel with the output of the second transistor, respectively to low noise power supplies defining the aforementioned range.

In a further aspect of this invention, the frequency determining network of the oscillator may comprise first and second crystal units connected in series with each other.

BRIEF DESCRIPTION OF THE DRAWINGS

The above and other objects and features of the subject invention will be better understood from the following detailed description of the invention taken in connection with the accompanying drawings, in which.

DESCRIPTION OF THE PREFERRED EMBODIMENTS OF THIS INVENTION

Figure 4:
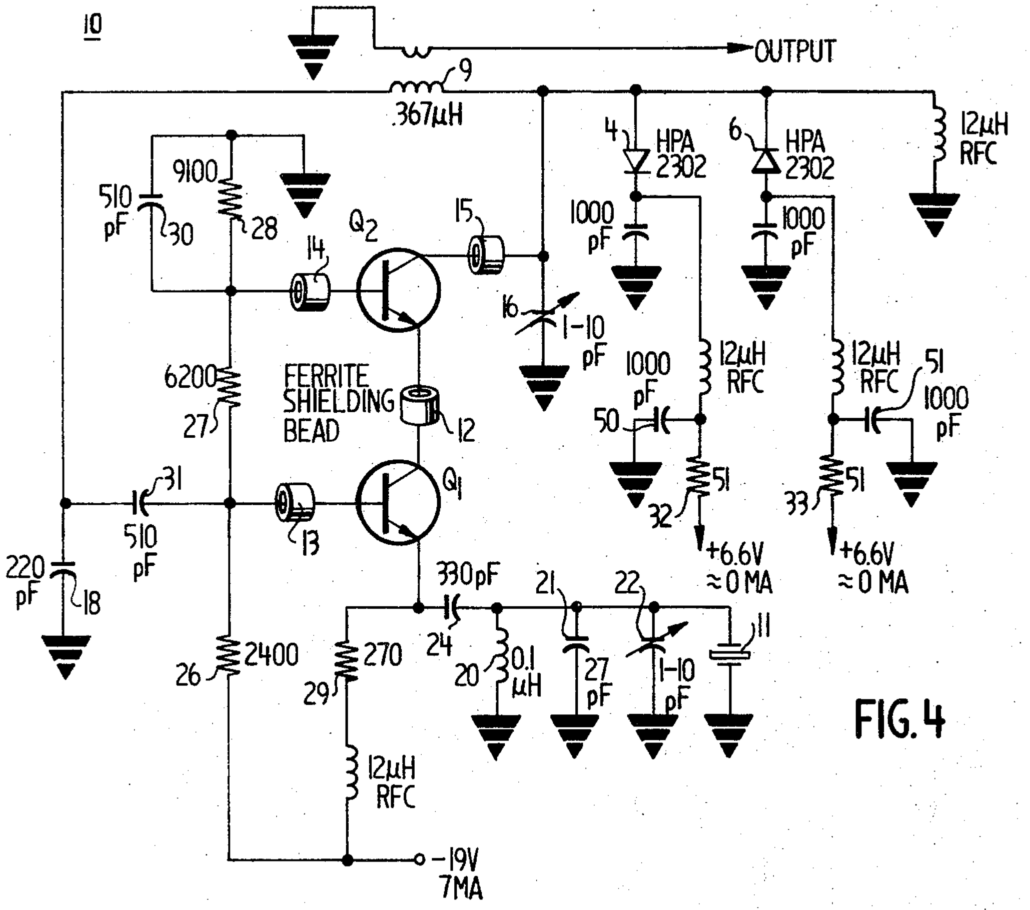
FIG. 4 shows schematically a control circuit of this invention for a crystal oscillator including cascode transistor amplifiers, quartz crystal and associated antiresonating, capacitive and inductive components, and hot carrier diode components.

With regard to the drawings and in particular to FIG. 4, a VHF crystal oscillator circuit 10 of this invention is shown. The operation of the circuit is best explained by discussing separately the major elements and then relating the functions of the elements to the total circuit. The circuit of FIG. 4 may be likened for the purposes of explanation to a VHF Colpitts oscillator in which the phase shifting property of a frequency selective feedback element controls the circuit frequency. The phase shift of the frequency selective circuit is given by the following equation:

$$d\phi/df = (-2Q_l/f_o) \text{ (radians/Hz)} \quad (4)$$

where $Q_l$ is the loaded or working Q of the crystal unit 11. The crystal units best suited for this service are AT-cut thickness shear resonators operated with power dissipation on the order of 250 to 500 microwatts. Fifth overtone VHF crystal units are particularly suited for low noise oscillator design.

In the 50 to 100 MHz frequency range, energy trapping considerations applied to design of the quartz crystal unit result in crystal unit 11 having resistance in the range of 30 to 50 ohms. At 50 MHz, the intrinsic Q of a natural quartz crystal is typically 250,000 and at 150 MHz is 83,000. At 75 MHz, the realizable $Q_x$ of the crystal unit will approach 0.9 of the intrinsic Q of the quartz. The circuit of FIG. 4 provides loaded $Q_l$ on order of 0.8 to 0.9 of crystal unit 11 $Q_x$ at HF, and 0.6 to 0.7 of crystal unit $Q_x$ at VHF.

Because collector current in the transistor $Q_1$ incorporated into the circuit 10 of FIG. 4 does not cut off, the impedance "Z" seen by the crystal unit 11 is given by the following equation:

$$Z \cong (26/Ie)\ [(h_{fe}/1 + h_{fe})] + (r_{bb}' + Z_s/1 + h_{fe}) \quad (5)$$

where:

Ie is the dc emitter curret in $Q_1$ in milliamperes.

$Z_s$ is the effective source impedance appearing between base of transistor $Q_1$ and ground.

$r_{bb}'$ is the base spreading resistance of the transistor $Q_1$.

$h_{fe}$ is the complex common emitter current gain of transistor $Q_1$ at the oscillation frequency.

$Z_s$ can be made very small due to the larger power gain afforded by the cascode amplifier configuration of $Q_1$ and $Q_2$. Transistors having $f_T$ of 900 to 1,000 MHz are used for $Q_1$ so that $$h_{fe} \cong 1.9 - j\,9.6$$

at $f$ = 100 MHz.

Where the crystal unit 11 has a resistance of 35 ohms and power dissipation of 500 microwatts, the signal current $i$ required to flow into the emitter of $Q_1$ is:

$$i = \sqrt{5 \times 10^{-4}/35} = 3.78 \times 10^{-3} \text{ amp rms.}$$

and the peak current $I_e$ is $\sqrt{2}\,i = 5.34 \times 10^{-3}$ amp. The resistance R presented the crystal unit 11 depends on both $Z_s$, $r_{bb}'$, $h_{fe}$ and on the $dc$ current flowing in $Q_1$. Part of the resistance is found from $$r_{e_{eff.}} \cong \frac{26}{I_0\sqrt{1-\left(\frac{i}{I_o}\right)^2}} \quad (6)$$

The maximum value of oscillating resonator $Q_l$, which approximates the Q of the entire circuit 10, results from small ratios of $i/I_o$. In contrast, it is desired to have large power dissipation in the crystal unit 11 in order to get maximum signal current in $Q_2$. For high dc current, the oscillating resonator $Q_l$ of the circuit 10 can be made to approach the $Q_x$ of the crystal unit 11; but increasing the dc current increases the current noise, represented as the white noise portion of $L_g(f)$.

The oscillating resonator $Q_l$ of the circuit 10 depends on the base spreading resistance $r_{bb}'$ of transistor $Q_1$ to some extent. When the resistance of the crystal unit 11 is 35 ohms or less, base spreading resistance is of some importance. Because of the high power gain afforded by the cascode circuit of this invention, the impedance seen from base to ground of transistor $Q_1$, which affects that portion of loading of the crystal unit 11 due to $Z_s$, is typically less than 5 ohms. For example, with 2N918 transistors for $Q_1$ the emitter impedance is increased over that simply given by $(r_e) + (r_{bb}' + Z_s)/(1 + h_{fe})$ in equation (5) by about 1.1 + $h$ 5.6 ohms. With the 2N3866 transistor for $Q_1$, the increase is about 0.6 = $j$ 2.5 ohms. With $5 \times 10^{-4}$ watts dissipation in the 35 ohm crystal unit, the ratio of the $Q_l$ of the oscillating resonator circuit 10 to the $Q_x$ of the crystal unit 11, i.e., $Q_l/Q_x$, is a function of transistor dc current as shown in Table I.

TABLE I

| I (dc) mA | $Q_l/Q_x$ (2N918) | $Q_l/Q_x$ (2N3866) |
|---|---|---|
| 6 | 0.81 | 0.83 |
| 7 | 0.83 | 0.85 |
| 8 | 0.86 | 0.875 |

If the dc current in transistor $Q_1$ is not sufficient to maintain conduction during the entire cycle of the oscillation, the oscillating resonator $Q_l$ is decreased. Since limiting is, however, absolutely a requirement in a harmonic oscillator it is provided by two hot carrier diodes 4 and 6 as shown in FIG. 4. Although this is the dominant limiting, some distortion may occur in transistor $Q_1$. The current flowing through transistors $Q_1$ and $Q_2$ is essentially the same so that equation (6) is not strictly correct because the current flowing in transistor $Q_1$ cannot be sinusoidal if the small signal gain of the oscillator circuit 10 is 3 to 6 dB greater than that required for constant amplitude sustained oscillation. The values in Table I (above) can thus be achieved only when minimum excess gain is provided.

It is also important that UHF parasitic oscillations do not occur in transistor $Q_1$ since they will cause the current to be different than expected, and result in higher resistance facing the crystal unit. Ferrite shielding beads 12, 13, 14 and 15 are employed as shown in FIG. 4 to eliminate UHF parasitic oscillations. Even with suppression of the parasitic oscillations there will be regeneration at the frequency of the parasitic resonator, and harmonics of the oscillation current will be enhanced slightly.

Practically, a conservative estimate for $Q_l/Q_x$ is 0.6 to 0.7. This value will permit the dc current to be reduced slightly to reduce the white noise.

The circuit of FIG. 4 thus will permit the frequency noise cut-off to be about 1,000 Hz at 100 MHz using a fifth overtone crystal unit. At 80 MHz, the frequency noise cut-off is then expected to be about 80/100 × 1,000 = 800 Hz. With typical variation in the $Q_x$ of the crystal unit 11 that has been observed on crystal units of the same basic design made over a period of several years, it would appear that the frequency noise cut-off of the 80 MHz oscillator may be expected to vary between 450 Hz and 900 Hz when employing fifth overtone crystal units at 500 microwatts drive level.

The instantaneous current flowing in the transistors $Q_1$ and $Q_2$ is always greater than zero in both transistors $Q_1$ and $Q_2$. This means that full advantage of the reduction in $L(f)$ of the transistors $Q_1$ and $Q_2$ by means of feedback is provided. $L(f)$ from the transistors is thus expected to be $L(f = 1\ Hz)$ or $L(1) \cong -128$dB/Hz when $Q_l/Q_x$ is 0.7, being determined by $Q_1$. Measurements made at the National Bureau of Standards show that for the hot carrier diodes, L(1) of −127 to −134 is exhibited, so that the $L_A(1)$ for the oscillator circuit 10 as shown in FIG. 4 is expected to be at least −127 dB/Hz. The hot carrier diodes 4 and 6 conduct when the potential developed across them exceeds 0.4 volt. The reverse breakdown typically exceeds 20 volts. Therefore, if ±6.6 volts dc is applied to the diodes 4 and 6 respectively, the level of oscillation at the collector of $Q_2$ will be in the order of 7 volts peak. The levels are selected so that typical voltage gain is 30 to 35 dB in the 80 to 100 MHz frequency range.

As stated before, the circuit 10 of FIG. 4 comprises an inductor 9 and capacitor elements 16 and 18. In effect, capacitance of the circuit 10 includes the total circuit capacitance from the collector of $Q_2$ to ground and the base of $Q_1$ to ground. By employing two transistors $Q_1$ and $Q_2$ in cascode configuration and a quartz crystal 11, the circuit resembles also a modified Butler or bridged tee type quartz crystal oscillator circuit. To provide antiresonance of the static capacitance of the crystal unit 11 at the crystal unit resonant frequency, an inductor 20 and capacitors 21 and 22 are connected in parallel with the crystal 11. A capacitor 24 is selected to series resonate the inductive part of the impedance Z (see equation 5) presented to the crystal unit 11 at the oscillation frequency. Transistors $Q_1$ and $Q_2$ are selected so that voltages involved will not cause avalanche and the minimum collector to base voltage of transistor $Q_2$ is made sufficient that $h_{fe}$ show negligible change during the cycle of collector voltage. Resistors 26, 27 and 28, connected in series between negative voltage source and ground, establish correct base biasing for transistors $Q_1$ and $Q_2$, and resistor 29, connected between the negative voltage source and the emitter of transistor $Q_1$, establishes emitter bias for transistor $Q_1$. Bypass is provided for the base of transistor $Q_2$ by a capacitor 30 and coupling is provided to the base of transistor $Q_1$ by a capacitor 31. Choke coils (RFC) are used as shown to decouple at the oscillator frequency with bypassing provided as shown by 1,000pF capacitors 50 and 51. Resistors 32 and 33 protect low noise regulator that provides the dc bias to hot carrier diodes 4 and 6 against short circuit.

In considering the operation of the VHF crystal oscillator circuit as shown in FIG. 4, the cascode connected transistors $Q_1$ and $Q_2$, and the circuit formed by the capacitances 16 and 18 and the inductive element 9 may be considered a first resonating circuit whose frequency is approximately resonant at the frequency of oscillation determined by the crystal unit 11, as will be more fully explained. Basically, resonance is established in the first resonating circuit, an output of which is taken from capacitor 18 and applied by the coupling capacitor 31 to the base of transistor $Q_1$. The oscillation voltage appearing across capacitor 18 causes a current to flow in transistor $Q_1$ whose magnitude and phase angle depend on the crystal unit dynamic impedance and the frequency of the voltage. Maximum current flow occurs at the crystal unit resonant frequency. The current flowing in transistor $Q_1$ also flows in the emitter of transistor $Q_2$. Because of the low impedance appearing at the emitter of transistor $Q_2$ owing to the bypassing of the base to ground for oscillation signal frequencies, the oscillation frequency voltage appearing at collector of transistor $Q_1$ is small, thus enhancing stability of the amplifier by virtue of the reduced voltage feedback to base of transistor $Q_1$ via the collector to base capacitance of transistor $Q_1$. The current flowing from collector of transistor $Q_2$ is nearly the value flowing into the emitter. This current develops a potential across the circuit comprising inductor 9, capacitor 16 and capacitor 18 as well as the load impedance reflected into the primary winding of the inductance 9, and diodes 4 and 6. The voltage maximum value is fixed by the clamping of diodes 4 and 6 which occurs when the oscillation voltage peak amplitude exceeds the contact potential of 4 and 6 plus the reverse biasing dc potential. The voltage appearing across capacitor 18 is nearly 180° out of phase with that appearing across capacitor 16. Therefore, maximum oscillation current occurs at the frequency where the crystal unit dynamic resistance alone appears as the circuit impedance connected to emitter ot transistor $Q_1$. Because of the fact that a slight phase shift occurs in transistor $Q_1$ between the voltage applied to base of $Q_1$ to ground, and the collector current flowing in transistor $Q_1$ a slight detuning from precise resonance at the oscillation frequency must exist in circuit 10 in VHF oscillators so that oscillation is exactly at the crystal unit frequency and the oscillation current is a maximum. The magnitude of the oscillating current flowing in transistor $Q_1$ is determined by the oscillation voltage level at which the collector of transistor $Q_2$ is clamped by back biased diodes 4 and 6, the ratio of capacitance of 18 and 16, and the crystal unit resistance. Crystal unit power dissipation is then controlled by the size of capacitance 18. The phase shifting property of the crystal unit 11 maintains oscillation at the crystal unit resonant frequency with an accuracy that depends on the loaded Q of elements 11, 20, 21 and 22.

In one illustrative embodiment of this invention, the crystal unit 11 employs an AT-cut fifth overtone crystal unit as the frequency reference element. The frequency stability of such an element is typically in the order of $5 \times 10^{-6}$ per year or better at a given temperature. Since the frequency of an AT-cut crystal resonator is dependent upon the angle of cut and the resonator temperature, as is well-known, temperature control may be required to maintain a reasonably good frequency stability. The crystal unit 11 preferably has a temperature "turnover" point (temperature at which df/dT=0) sufficiently high that control of temperature within plus or minus 10° C will result in a frequency variation of less than $\pm (4 \times 10^{-6}) (f_o)$Hz. The resonant frequency of the first resonating circuit is selected to be nearly that of the crystal unit resonant frequency and the antiresonating circuit serves, as will be described to minimize the noise at higher Fourier frequencies. high that In particular, the antiresonating circuit includes the inductance 20, the capacitive element 21 and the variable capacitive element 22 connected in parallel with the crystal unit 11. The values of the elements 20, 21 and 22 are selected to provide the second resonant circuit with a resonant frequency substantially equal to that of the crystal unit 11. Further, the values of these aforementioned elements are selected to couple efficiently the output of the crystal unit 11 through the coupling capacitor 24 to the emitter of transistor $Q_1$. In this manner, the impedance of the circuit connected to the emitter of transistor $Q_1$ is a minimum value equal to the crystal unit resistance at the oscillation frequency and increases monotonically to a large value for both positive and negative offset frequencies $f$ from the osci-lation frequency. Such impedance increase with increasing f substantially reduced $L_A(f)$.

Further, it is desired to prevent the operation of transistors $Q_1$ and $Q_2$ in non-linear manner to provide the oscillator limiting function. In particular, diodes 4 and 6 are connected in common to the collector of transistor $Q_2$ and respectively, to low noise sources of dc potentials, e.g. +6.6V and −6.6V, for establishing limits of conduction whereby transistors $Q_1$ and $Q_2$ may not operate with significant non-linearity when the size of capacitances 18 and 16 are appropriately selected. The low noise potential sources will be described in detail later. The limiting circuit formed by the diodes 4 and 6 and their respective low noise power supplies is connected in parallel with the collector of transistor $Q_2$. It is understood that if the transistors $Q_1$ and $Q_2$ were allowed to be driven to saturation, the output thereof would be, in effect, clipped, thereby introducing harmonics and reducing the effective $Q_l$ of the entire circuit 10. Thus in operation, when the current passing from the collector of transistor $Q_2$ to the first resonating circuit approaches the limit of saturation, the diodes 4 and 6 conduct to draw current from the first resonating circuit and thus prevent the increase in voltage across capacitor 16 and hence capacitor 18, so that transistor $Q_1$ is not driven into saturation.

Figure 1A:
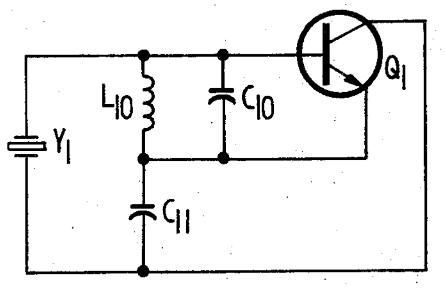
FIG. 1(a) PRIOR ART
FIGS. 1*a* to 1*f* show schematically a control circuit for a crystal oscillator in accordance with the prior art.
Figure 1B:
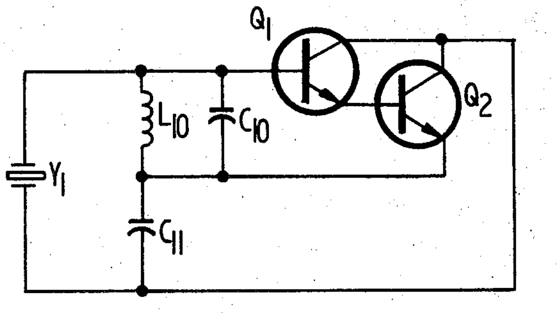
FIG. 1(b) PRIOR ART
Figure 1C:
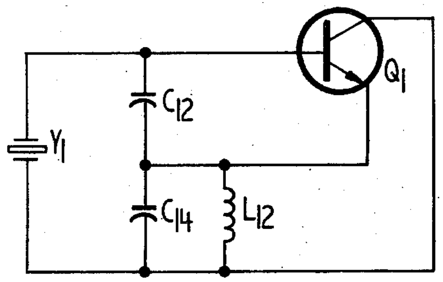
FIG. 1(c) PRIOR ART
Figure 1D:
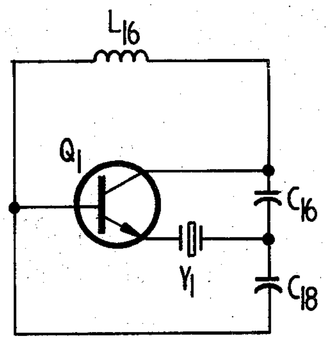
FIG. 1(d) PRIOR ART
Figure 1F:
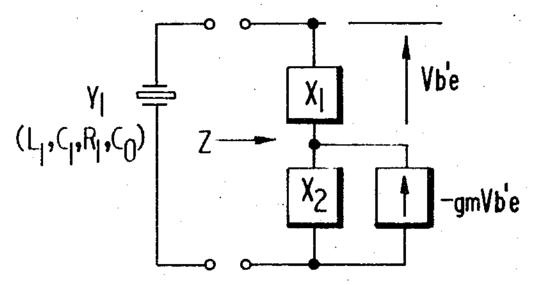
Figure 1E:
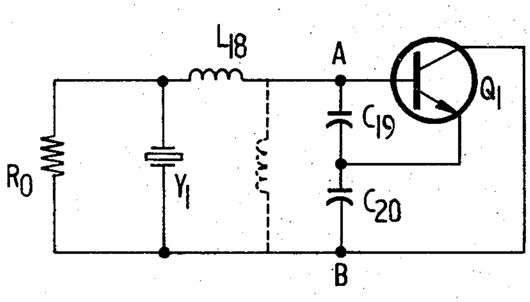
FIG. 1(e) PRIOR ART
Figure 2:
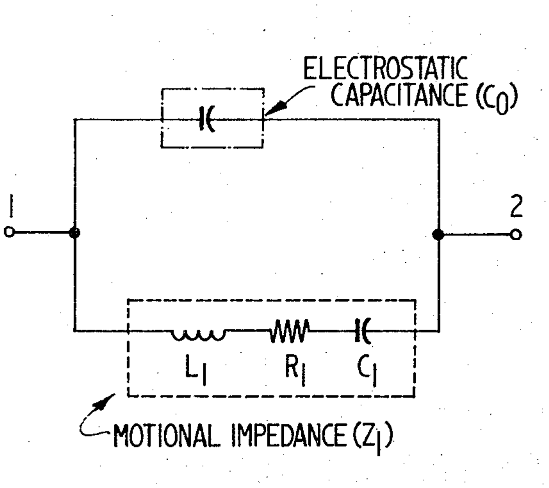
FIG. 2 is a simplified electrical equivalent circuit of a quartz crystal unit.
Figure 5:
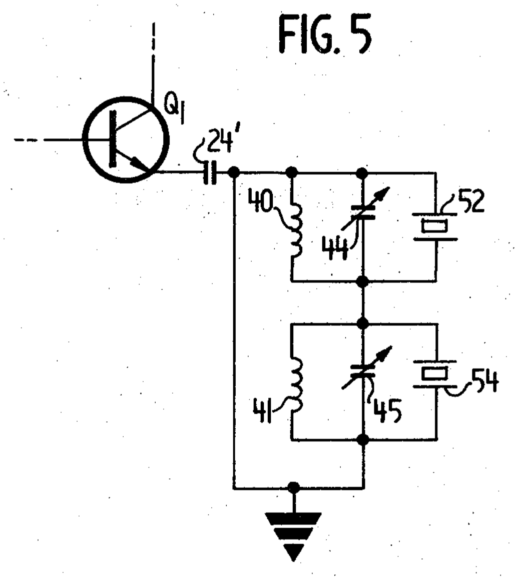
FIG. 5 shows an alternative embodiment of this invention including additional circuitry to incorporate two crystals in the VHF oscillator of the circuit of FIG. 4.
Figure 3:
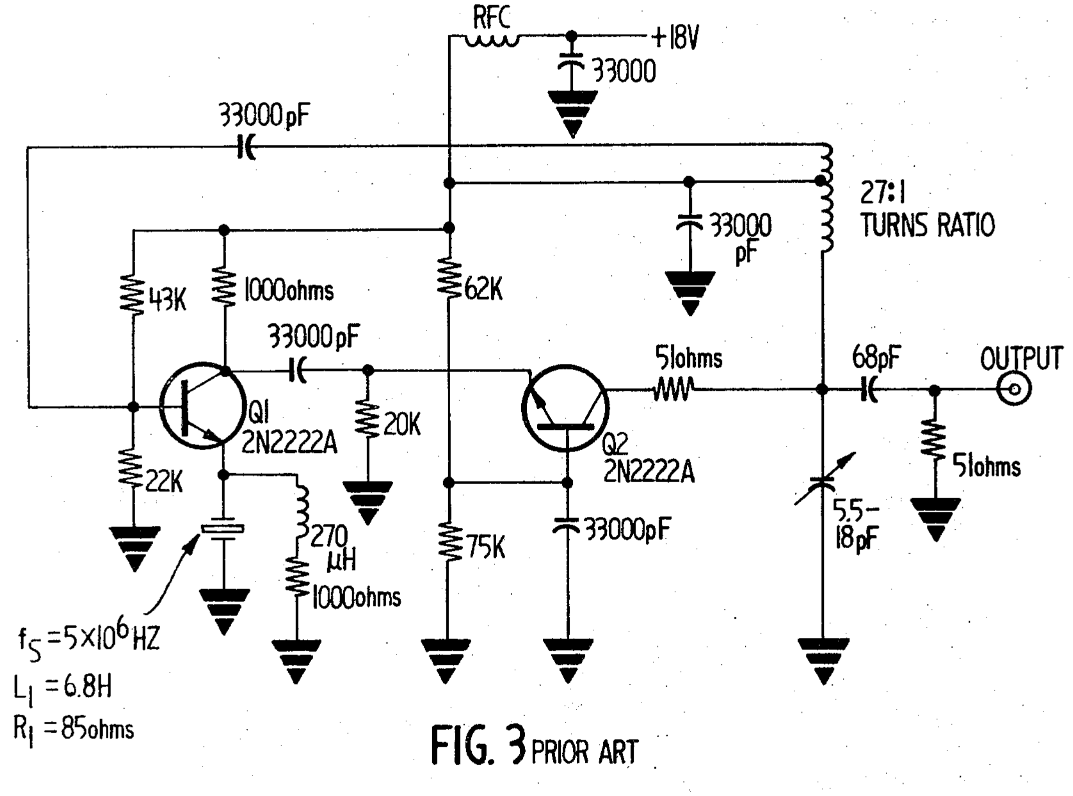
FIG. 3 PRIOR ART
FIG. 3 is a circuit diagram showing a cascode type quartz crystal oscillator of the prior art.

A further improvement to the circuit of FIG. 4 is shown in FIG. 5. Therein, two crystal units 52 and 54 are employed in series. The three following advantages are obtained by employing this configuration: (1) the negative feedback effective in the $Q_1$ circuit is increased resulting in 6 dB additional reduction of $L(f)$; (2) since the resonator resistance is doubled, the value of $Q_l/Q_x$ is increased even if the current in $Q_1$ is not increased, but only $Z_s$ is increased to maintain oscillation; and (3) since the mount mechanical resonances in the two crystal units are high Q resonances and will normally be at slightly different frequencies, an improvement in FM noise performance in a severe vibration environment is expected. It should be noted that a key factor in realizing a working circuit with two crystal units 52 and 54 having the same nominal frequency and connected in series, is the antiresonating of the electrostatic capacitance of each crystal unit at the crystal unit resonant frequency. The antiresonating of this capacitance, however, is also a significant improvement over the circuits previously used, since it causes the impedance in the external circuit of the emitter ($Z_E$) of transistors $Q_1$ and $Q_2$ to increase as frequency departs from the nominal oscillator frequency. This impedance is expressed by the following equation:

$$Z_E = R_1 + j\,[(f - f_s)/\pi f_s^2 C_1] \text{ ohms,} \tag{7}$$

when the total external shunting capacitance at the emitter is antiresonated. It is important, however, that in using two series connected crystal units 52 and 54, two inductors 40 and 41 may be employed as shown in FIG. 5; otherwise the full benefit of equation (7) in reducing the noise current flowing in the collector as the Fourier frequency increases will not be realized. Capacitors 44 and 45 are employed as before to antiresonate the crystal units static capacitance in combination with inductances 40 and 41.

The cascode arrangement of transistors $Q_1$ and $Q_2$ as shown in FIG. 4 permits the realization of relatively large VHF voltage swing at the collector of transistor $Q_2$. Since the limiting action occurs when the potential across either of the hot carrier diodes 4 and 6 exceeds about 0.4 volt, the peak sinusoidal waveform appearing at the collector of transistor $Q_2$ will be 0.4 volt plus the bias applied to the hot carrier diode. To prevent limiting due to collector voltage bottoming, the minimum dc plus VHF instantaneous voltage appearing between base and collector of the transistor $Q_2$ should be greater than 3 or 4 volts and preferably 5 volts. The maximum instantaneous potential is limited by onset of avalanche currents. With reference to FIG. 4, 2N918 and 2N2857 type transistors may illustratively be employed as transistors $Q_1$ and $Q_2$. The 2N3866 for transistor $Q_2$ and 2N5109 for transistor $Q_1$ is a more desirable selection. For these transistors, a peak collector to base potential of 18 to 20 volts is found acceptable from measurement using a Tektronix Transistor Curve Tracer or an equivalent thereof.

A swing of ±7 volts with quiescent dc potential of 10 volts is selected for the collector to base potentials of the transistor $Q_2$. Because of available Zener diodes, the actual voltage employed is only ±6.6 volts.

The signal current is determined by crystal unit dissipation. In order not to be troubled by excess crystal unit noise the drive level must not exceed about 500 microwatts. With crystal resistance of 35 ohms, the peak current $I_p$ is $5.34 \times 10^{-3}$ amp.

The effective impedance in the collector circuit can then be simply $$Z_L = \frac{V_p}{\alpha_1 \alpha_2 I_p} \cong \frac{6.6}{\left(\frac{12}{13}\right)\left(\frac{12}{13}\right) 5.34 \times 10 - 3} = 1450 \text{ ohms,} \tag{8}$$

where $\alpha_1$ and $\alpha_2$ are respectively the collector to emitter signal current ratios of transistors $Q_1$ and $Q_2$, $V_p$ is the peak collector voltage and $I_p$ is the peak signal current flowing through crystal unit 11.

With sufficiently high capacitance in the emitter anti-resonant circuit and series resonating of the inductive part of the emitter impedance of transistor $Q_1$, the VHF voltage appearing across the crystal unit 11 will be ≈0.8 of the base to ground voltage thereof for oscillating resonator $Q_l$ of 0.8 $Q_x$. The voltage is then permitted to be 0.23 volts peak or 0.165 volts rms. Since the voltage at the collector of the transistor $Q_2$ is fixed by the limiter circuit at 6.6 volts peak, crystal unit drive level is determined primarily by the capacitance from the base of transistor $Q_1$ to ground and collector of transistor $Q_2$ to ground. For the best performance, use the lowest capacitance possible at collector to ground of transit or $Q_2$. This yields the lowest Q for the circuit including inductance 9, capacitor 16 and capacitor 18.

A tuning adjustment is provided to accommodate reflected load reactance and inductance tolerance of inductance 9 as incorporated in circuit 10 of FIG. 4. A trimming capacitor 16 illustratively of 1–10 pF is connected between ground and the point of interconnection between transistor $Q_1$ and inductance 9. the $C_{ob}$ of transistor $Q_1$ plus stray wiring plus capacitance of the limiting diodes 4 and 6 is about 6.0 pF. Selecting capacitor 16 to be set at 4.0 pF, the total C is about 10 pF and inductor 9 ≈ 0.367 microhenries apparent inductance. Assuming a Q of 100 for inductor 9, $R_p \approx (2\pi)(83)(10^6)(100)(0.367)(10^{-6}) = 19{,}139$ ohms. The step down in voltage from collector to base of transistor $Q_2$ is permitted to be a minimum of 6.6/0.23 = 28.69. This then also is the ratio of capacitances 18 to 16. A capacitor 18 connected between the base of the transistor Q1 and ground with dc isolation provided by capacitor 31, is then somewhat less than 280 pF. Because of the reactance of the lead inductance, the actual capacitance of capacitor 18 must be in the order of 200 to 220 pF.

Letting the dc current through transistor $Q_1$ be 6.0 mA, the effective transconductance of the transistor $Q_1$ (small signal) at crystal unit resonant frequency will be:

$$\frac{\frac{6.0}{26}}{1 + 35\frac{6}{26}} = 0.025 \text{ mho}$$

The small signal gain from the base of transistor $Q_1$ to the collector of transistor $Q_2$ must exceed 28.69 for oscillation to build up. With 1,450 ohm load, the gain is 36.25. Since the excess gain is only 2 dB, a somewhat smaller value for the capacitor 18 may be used to insure starting. Letting excess gain be 3 dB, the useful oscillator load that is permitted is about 2,500 ohms. The power from the oscillator that is available to excite the frequency multiplier is then:

$$6.6 \times 6.6/\mathbf{2} \times 2{,}500 = 8.7 \text{ milliwatts} \cong +9.39 \text{ dBm.}$$

The impedance of $Z_s$ is $1{,}450/(28)^2 = 1.85$ ohms so thermal noise associated with $Z_s$ is negligible. However, the noise voltage due to the $r_{bb}'$ of the transistor $Q_1$, the equivalent shot noise voltage and the resistance of a Ferrite bead required for UHF parasitic oscillation suppression will be about $1.28 \times 10^{-10} \sqrt{50 + 30 + [26/(2)(6)]df} = 1.16 \times 10^{-9}$ (volts rms/Hz 1/2). The noise voltage associated with crystal unit resistance is $7.5 \times 10^{-10}$ (volts rms/Hz 1/2). The noise current $i_{nl}$ will be $$i_{nl} \cong \sqrt{(2)(1.6)(10^{-19})(6/50)(10^{-3})df} = 6.2 \times 10^{-12} \text{ (Amp/Hz1/2),}$$

where $i_{nl}$ current flows through the input impedance of transistor $Q_1$ paralleled by $Z_s + r_{bb}' + R + j\,x_{bb}'$, where R is the loss introduced by a Ferrite bead. The division of this current results in the equation:

$$i_{(collector)} \cong h_{fe}\,(Z_s/Z_{in}/1 + Z_s/Z_{in})i_{nl} \quad (9)$$

This yields:

$$i \cong 3\,i_{nl} \quad (10)$$

The collector noise of the transistor $Q_1$ current due to the voltage noise is approximately $$\sqrt{(0.75)^2 + (1.16)^2}\ 10^{-9}/35 = 3.94 \times 10^{-11} \text{A/Hz}^{1/2}$$

The total noise current is $4.4 \times 10^{-11}$ AMP/Hz1/2 due to the transistor noise. A negligible noise current also exists from the noise current flowing in 1,450 ohms due to the noise voltage developed across the dynamic impedance of the hot carrier diodes 4 and 6 by the shot noise associated with the diode dc current.

This leads to a white $L_A(f)$ prediction of:

$$L_A(f) = 20\log_{10}[(4.4)(10^{-11})/(2)(\sqrt{2})(5.34)(10^{-3})] = -170\text{dB/Hz.}$$

However, the noise at high Fourier frequencies where the white noise dominates over the flicker of phase noise actually is much less than $4.4 \times 10^{-11}$ Amp/Hz$^{1/2}$ because of equation (7).

For an 80 MHz fifth overtone crystal unit 11 with a $Q_x$ of 100,000 and the resistance of 35 ohms, the dynamic capacitance of the crystal unit 11 will be:

$$1/(2\pi)(80)(10^6)(35)(10^5) = 5.68 \times 10^{-15} \text{ farads}$$

The impedance of the crystal unit 11 becomes from equation (7) 408 ohms at Fourier frequency of 5,000 Hz. The collector current noise of transistor $Q_1$ resulting from the voltage noise then becomes $1.38 \times 10^{-9}/408 = 3.38 \times 10^{-12}$ Amp/Hz1/2. The current noise of transistor $Q_1$ is also reduced. The result is that the white $L_A(f)$ of the oscillator circuit 10 of FIG. 4 is much lower than −170 dB/Hz.

Frequency noise as well as the additive flicker noise cut-in frequency depends on the oscillating resonator $Q_l$. For crystal unit $Q_x$ of 100,000, the oscillating resonator $Q_l$ attainable at 80 MHz will be about 70,000. At signal frequencies where the complex common emitter current gain of the transistor has a small phase angle, L(1) would be reduced by $20\log_{10}$ 35/26/6 = 18dB using one crystal unit 11 and 24 dB using two series connected crystal units 52 and 54. With the circuit of FIG. 5, L(1) is then −133dB/Hz. The L(1) of the circuit should then be on the order of −129 to −130 dB/Hz since the flicker of phase of the hot carrier diodes 4 and 6 is also involved.

At 80 MHz, however, the 18 dB reduction is not obtained, if transistors of low performance are used. The reason, of course, is that $h_{fe}$ is complex at 80 MHz. The effect of this characteristic is that only 13 dB reduction in the low frequency L(*f*) can be expected. Thus L(1) = −128 dB/Hz is expected from the circuit of FIG. 4 at 80 MHz. With oscillating resonator $Q_l$ of 70,000, the frequency noise cut-off will be $f_c$ = 571 Hz; $L_G(500)$ is then $-27 - 128 + 10 \log_{10} (1 + \{571/(2)\ 500\}^2) = -153$ dB/Hz with times 40 frequency multiplication and $L_G(500)$ at S-band is then −121 dB/Hz.

Above $f_c$, it is expected that $L_G(f)$ will drop at a rate between $1/f^2$ and $1/f^3$. The exact shape is a function of the relative magnitude of white noise and frequencies above $f_c$ and the manner in which the complex impedance whose magnitude is given by equation (7), increases with Fourier frequency thus increasing the impedance of transistor circuit $Q_1$ from base to ground which then diverts current noise more effectively through the complex load equivalent to $r_{bb}' + Z_s$.

The ultimate white S/N, however, is limited by the value of $i_{Nl}$. Thus, the ultimate white $L_G(f)$ due to transistor current noise is expected to approach:

$$20 \log_{10} 6.2 \times 10^{-12} / \sqrt{2}(2)(5.34)(10^{-3}) = -187 \text{ dB/Hz}$$

The thermal noise associated with the collector load impedance of transistor $Q_1$, however, is $$1.28 \times 10^{-10} / \sqrt{1{,}450} = 3.36 \times 10^{-12} \text{ A/Hz}^{1/2}$$

Therefore, the ultimate $L_G(f)$ of the oscillator will only be −186 dB/Hz. Additional reduction of ultimate $L_G(f)$ occurs with increase in $h_{fe}$, but it cannot be fully realized since the oscillator noise at high Fourier frequencies will be masked by the additive phase noise introduced by the frequency multiplier circuits.

The voltage noise was seen to be an ENSI of $1.16 \times 10^{-9}$ $v$/Hz]. Reduction of this source of noise in the collector noise to a value less than current noise occurs when $Z_E$ becomes greater than $$1.16 \times 10^{-9} / 6.2 \times 10^{-12} = 187 \text{ ohms}$$

It is obvious that a relatively high capacitive antiresonant circuit including capacitor 21 is thus permissible across the crystal unit 11 using very small low Q inductor 21. For example, if the inductor 21 has a Q of 20, the capacitor 21 is 30pF, the inductor 80 MHz from emitter to ground would be 0.13 microhenries and the impedance at high Fourier frequencies will be limited to $Q\,\omega\,L$ = 1,960 ohms so that the contribution to $L_G(f)$ at such frequencies by the voltage noise will be less than 1 dB.

The motional impedance becomes 187 ohms at Fourier frequency of about 2,300 Hz and at $f$ = 23,000 Hz the contribution of the voltage noise becomes negligible. At $f$ = 2,300 Hz then:

$$L_G(f) \cong 3 + 20 \log_{10} \sqrt{2} \times 6.2 \times 10^{-12} \times 1.4375 / \sqrt{2} \times 2 \times 5.34 \times 10^{-3} = -178\text{dB/Hz}$$

With frequency multiplication by 40 times, the output $L_G(f)$ due only to the oscillator at $f$ = 2,300 Hz would then be −145dB/Hz. However, this phase noise will be masked by the phase noise of the circuits following the oscillator. The −145dB/Hz is due to white noise sources only. With an ideal frequency multiplier, this still would not be observed since the $1/f$ portion of $L_G(f)$ in the oscillator still dominates at $f$ = 2,300 Hz.

It is essential that no bi-mode frequency multipliers, employing step recovery diodes, be employed following the oscillator. Such multiplier circuits cause the $L_G(f)$ of the oscillator of the invention to be masked by additive phase noise.

Figure 6A:
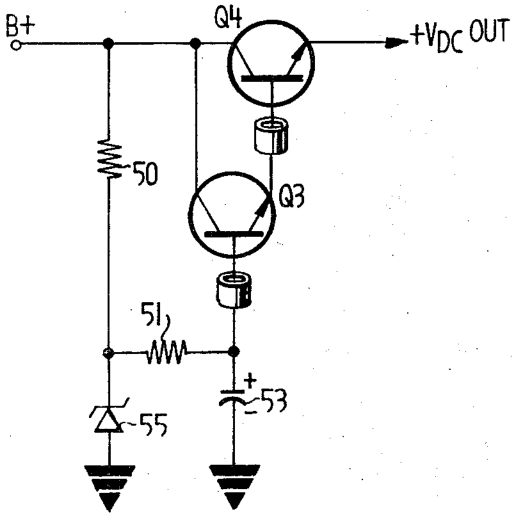
FIGS. 6A and 6B show, respectively, circuits for providing a low noise positive voltage and for providing a low noise negative voltage.
Figure 6B:
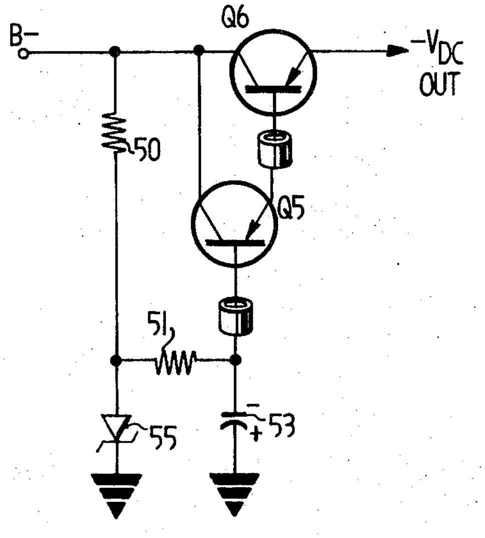

The low noise performance of the oscillator circuit 10 results in part from the provision for low noise from the level setting dc supplies. Low noise power is achieved employing circuits illustrated in FIGS. 6A and 6B. In these circuits, resistor 50 is selected for proper current in the Zener diode 55. Resistor 51 and capacitance 53 are selected for a time constant of 0.1 seconds with a DC voltage drop across the resistor 51 equal approximately to 0.025 volts. Transistors $Q_3$ and $Q_4$ are NPN type for $+V_{DC}$ output and transistors $Q_5$ and $Q_6$ are PNP to provide a $-V_{DC}$ output.

Figure 8:
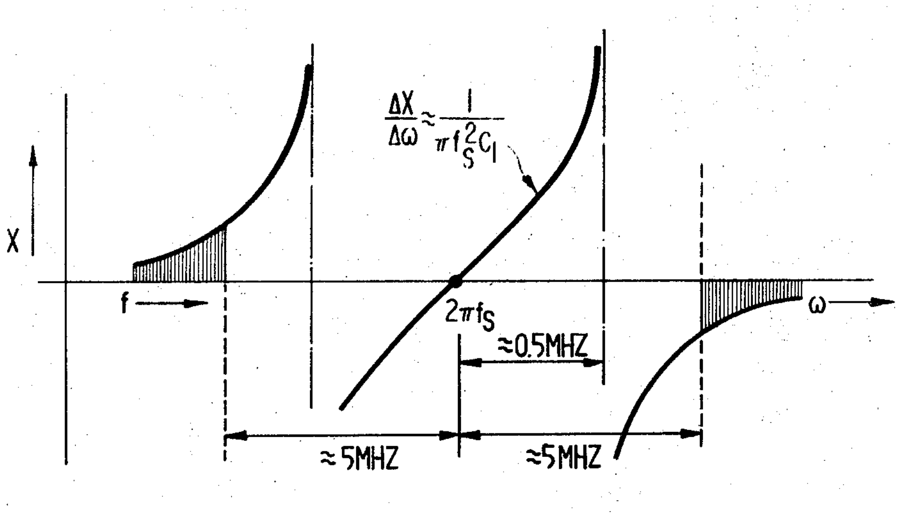
FIG. 8 is a graph showing the reactance exhibited by the quartz crystal unit circuit with the crystal unit static capacitance antiresonated as shown in FIG. 4.

Because the reactance versus frequency of the antiresonated crystal unit 11 is as shown in FIG. 8, there will be Fourier frequencies $f$ reached at which the negative feedback provided by the antiresonated crystal unit 11 begins to decrease at 20dB/decade. At Fourier frequencies $f$ greater than 50.0 kHz to 1 MHz, $S_{\delta\phi}(f)$ of the oscillator will increase. In the application of the low noise oscillator circuit 10 of this invention to radar and communications systems, the oscillator harmonic should be employed to control the phase of an L-band transistor $V_{co}$ which is designed with a full coaxial resonator. The $V_{co}$ noise will then be equal to that of the oscillator and harmonic generator at a frequency of approximately 50,000 Hz. In FIG. 8, the shaded region indicates a frequency range for which effective negative feedback is reduced resulting in an increase in oscillator $S_{\delta\phi}(f)$.

Figure 7:
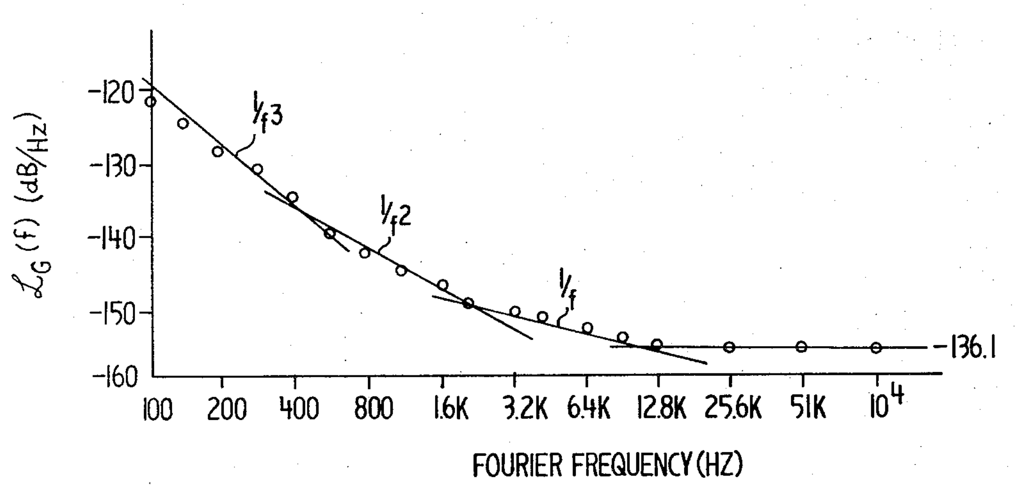
FIG. 7 is a graph of FM/PM sideband noise measurements made at 320 MHz of the 80 MHz VHF crystal oscillator incorporated in the circuit of FIG. 4.

Two of the low noise oscillator circuits of this invention were constructed with low noise frequency multiplier circuits to produce, in each, an output frequency of 320 MHz. The outputs of the two oscillators with multipliers were heterodyned together with a beat note of 400 Hz so that the frequency variance could be measured with a computing counter and $L_G(f)$ then be determined for $f$ = 1Hz to 100Hz. Also the two oscillators with multipliers were phase locked with a loop having backwidth less than 100 Hz, and the spectral density of the uncorrelated phase analyzed. Measurements were made to determined $L_G(f)$ from 100 Hz to 50,000 Hz, which results are shown in FIG. 7. Note that for the values of $L_G(f)$ as shown in FIG. 7, the frequency was 320 MHz. At low frequencies, the use of two crystal units in series will lower the FM noise nearly 6dB. At high Fourier frequencies, the dominant noise displayed by $L_G(f)$ at 320 MHz is due to the noise of the frequency multiplier.

Numerous changes may be made in the above-described apparatus and the different embodiments of the invention may be made without departing from the spirit thereof; therefore, it is intended that all matter contained in the foregoing description and in the accompanying drawings shall be interpreted as illustrative and not in a limiting sense.

What is claimed is:

1. An oscillator circuit for generating a low noise, high frequency output signal, said oscillator circuit comprising:

a. first and second amplifier means, each having first and third terminals for receiving an input whereby an output derived from its second terminal is determined, said third terminal of said second amplifier means coupled to said second terminal of said first amplifier means;

b. a first resonant circuit coupled to said second terminal of said second amplifier means and to said first terminal of said first amplifier means, whereby a resonating signal is established between said first resonating circuit and said first and second amplifier means; and c. a second resonant circuit coupled to said third terminal of said first amplifier means and including a capacitive element, an inductive element and a reference frequency element, for establishing the frequency of the resonating signal through said first and second amplifier means, the values of said inductive and capacitive elements selected to establish antiresonance therein at the reference frequency of said reference element.

2. The oscillator circuit as claimed in claim 1, wherein said first and second amplifier means each comprises a transistor having base, emitter and collector elements, said emitter element of said second transistor coupled to said collector element of said first transistor.

3. An oscillator circuit as claimed in claim 2, wherein said collector of said first transistor is directly connected to said emitter of said second transistor.

4. The oscillator circuit as claimed in claim 1, wherein the reference frequency element comprises a quartz crystal unit.

5. The oscillator circuit as claimed in claim 1, wherein the reference frequency element comprises an AT-cut overtone crystal unit.

6. The oscillator circuit as claimed in claim 1, wherein there is further included a limiting circuit coupled to said third terminal of said second amplifier means for establishing a range of voltages in which said first and second amplifier means may be driven without reaching the saturation limits of said first and second amplifier means.

7. The oscillator circuit as claimed in claim 5, wherein said limiting circuit includes first and second unidirectional conducting means coupled respectively to low noise power sources of first and second levels corresponding to the limits of said range.

8. The oscillator circuit as claimed in claim 1, wherein said first resonant circuit includes a first capacitive element coupled to said first terminal of said first amplifier means, an inductive element coupled between said first terminal of said first amplifier means and said second terminal of said second amplifier means, and a second capacitive element connected to said second terminal of said second amplifier means.

9. The oscillator circuit as claimed in claim 1, wherein said second resonant circuit further includes a second reference element connected in series with said first reference frequency element, to said third terminal of said first amplifier means.

10. The oscillator circuit as claimed in claim 9, wherein said second reference frequency element has a third resonant circuit including an inductive element and a capacitive element connected in parallel thereto, the values of the elements of said second and third resonant circuits selected to antiresonate the electrostatic capacitance of said first and second reference frequency elements at the resonating frequencies of said first and second reference frequency elements.

* * * * *